United States Patent
Inagawa

(10) Patent No.: US 9,312,839 B2
(45) Date of Patent: Apr. 12, 2016

(54) BUFFER CIRCUIT AND SEMICONDUCTOR INTEGRATED CIRCUIT

(71) Applicant: SOCIONEXT INC., Yokohama-shi, Kanagawa (JP)

(72) Inventor: Ryoichi Inagawa, Akiruno (JP)

(73) Assignee: Socionext Inc., Yokohama (JP)

(*) Notice: Subject to any disclaimer, the term of this patent is extended or adjusted under 35 U.S.C. 154(b) by 0 days.

(21) Appl. No.: 14/256,815

(22) Filed: Apr. 18, 2014

(65) Prior Publication Data

US 2014/0320187 A1    Oct. 30, 2014

(30) Foreign Application Priority Data

Apr. 26, 2013   (JP) ................................ 2013-093259

(51) Int. Cl.
*H03K 3/017*    (2006.01)
*H03K 5/156*    (2006.01)
*H03K 5/26*    (2006.01)

(52) U.S. Cl.
CPC ................ *H03K 5/1565* (2013.01); *H03K 5/26* (2013.01)

(58) Field of Classification Search
CPC .......... H03K 5/26; H03K 5/1565; H03K 7/08

USPC ............................................. 327/175; 326/87
See application file for complete search history.

(56) References Cited

U.S. PATENT DOCUMENTS

| 6,967,514 | B2 * | 11/2005 | Kizer et al. | 327/175 |
|---|---|---|---|---|
| 8,462,906 | B1 * | 6/2013 | Ding | 375/355 |
| 2004/0232967 | A1 | 11/2004 | Ishimi | |
| 2005/0218945 | A1 | 10/2005 | Kobayashi | |
| 2009/0295446 | A1 * | 12/2009 | Yun et al. | 327/175 |
| 2012/0007647 | A1 * | 1/2012 | Shim et al. | 327/175 |
| 2013/0342252 | A1 * | 12/2013 | Li et al. | 327/175 |

FOREIGN PATENT DOCUMENTS

| JP | 2004-348573 A | 12/2004 |
|---|---|---|
| JP | 2005-159613 A | 6/2005 |
| JP | 2005-294947 A | 10/2005 |

\* cited by examiner

*Primary Examiner* — Kenneth B Wells
(74) *Attorney, Agent, or Firm* — Arent Fox LLP

(57) ABSTRACT

A buffer circuit section receives an input clock, and outputs an output clock by wave-shaping the input clock, a measurement circuit section measures a first pulse width at a first potential level of the output clock and a second pulse width at a second potential level of the output clock, and an adjustment circuit section adjusts a ratio between the first pulse width and the second pulse width by varying a drive capability of the buffer circuit section on the basis of the measurement result of the measurement circuit section.

10 Claims, 12 Drawing Sheets

SEMICONDUCTOR INTEGRATED CIRCUIT 1

LINES

```
1: curmindiff = TOTAL NUMBER OF STAGES OF DELAY BUFFERS OF DELAY ADJUSTMENT CIRCUIT +1
2: pchmindiff = 0
3: nchmindiff = 0
4: for({ pchN_en, ··· ,pch2_en, pch1_en } = 1; { pchN_en, ··· ,pch2_en, pch1_en } < 2^N; { pchN_en, ··· ,pch2_en, pch1_en }++ ){
5:   for({ nchN_en, ··· ,nch2_en, nch1_en } = 1; { nchN_en, ··· ,nch2_en, nch1_en } < 2^N; { nchN_en, ··· ,nch2_en, nch1_en }++ ){
6:     PULSE WIDTH MEASUREMENT
7:     hpwidth = High Pulse WIDTH MEASUREMENT VALUE
8:     lpwidth = Low Pulse WIDTH MEASUREMENT VALUE
9:     if (|hpwidth - lpwidth| < curmindiff ){
10:      curmindiff = |hpwidth - lpwidth|
11:      pchmindiff = { pchN_en, ··· ,pch2_en, pch1_en }
12:      nchmindiff = { nchN_en, ··· ,nch2_en, nch1_en }
13:     }
14:   }
15: }
16: { pchN_en, ··· ,pch2_en, pch1_en } = pchmindiff
17: { nchN_en, ··· ,nch2_en, nch1_en } = nchmindiff
```

FIG. 7

```
1: for( { pchN_en, ... ,pch2_en, pch1_en } = 1; { pchN_en, ... ,pch2_en, pch1_en } < 2^N; { pchN_en, ... ,pch2_en, pch1_en }++ ){
2:   for( { nchN_en, ... ,nch2_en, nch1_en } = 1; { nchN_en, ... ,nch2_en, nch1_en } < 2^N; { nchN_en, ... ,nch2_en, nch1_en }++ ){
3:     PULSE WIDTH MEASUREMENT
4:     if( ( ADC OUTPUT - VDD/2 ) == IDEAL VALUE(50:50) ){
5:       exit
6:     }
7:   }
8: }
```

FIG. 12

BUFFER CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2013-093259, filed on Apr. 26, 2013, the entire contents of which are incorporated herein by reference.

FIELD

The embodiments discussed herein relate to a buffer circuit and a semiconductor integrated circuit.

BACKGROUND

In a semiconductor integrated circuit and/or a system including a semiconductor integrated circuit, for example, a clock generated by a clock generation circuit, such as a PLL (Phase Locked Loop) circuit, is supplied to a circuit which performs operations, such as calculation, in synchronization with a rising or falling timing of the clock. In this case, for example, the clock is supplied to a circuit at a position away from the clock generation circuit via a clock path including a plurality of stages of buffer circuits (called clock buffers).

Note that, conventionally, there have been a technique for correcting the duty ratio of a clock generated from a PLL or the like to 50:50, and a technique for varying the duty ratio in accordance with the scale and/or characteristics of a circuit receiving the clock. Note that the duty ratio of 50:50 indicates that in one cycle of clock the percentage occupied by the pulse width at an H (High) level is 50% and the percentage occupied by the pulse width at an L (Low) level is 50%.

Japanese Laid-open Patent Publication No. 2005-159613
Japanese Laid-open Patent Publication No. 2004-348573
Japanese Laid-open Patent Publication No. 2005-294947

However, due to variations in the characteristics of transistors included in a buffer circuit of a clock path, when a clock arrives at a circuit operating with the clock, the duty ratio of the clock differs from an intended one and thus there is a possibility that the circuit does not operate properly.

SUMMARY

According to an aspect, there is provided a buffer circuit including: a buffer circuit section which receives an input clock, and outputs an output clock by wave-shaping the input clock; a measurement circuit section which measures a first pulse width at a first potential level of the output clock and a second pulse width at a second potential level of the output clock; and an adjustment circuit section which adjusts a ratio between the first pulse width and the second pulse width by varying a drive capability of the buffer circuit section on the basis of a measurement result of the measurement circuit section.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 illustrates an example of a code describing the operation of an adjustment circuit section;

FIG. 12 illustrates an example of a code describing the operation of the adjustment circuit section.

DESCRIPTION OF EMBODIMENTS

Figure 1:
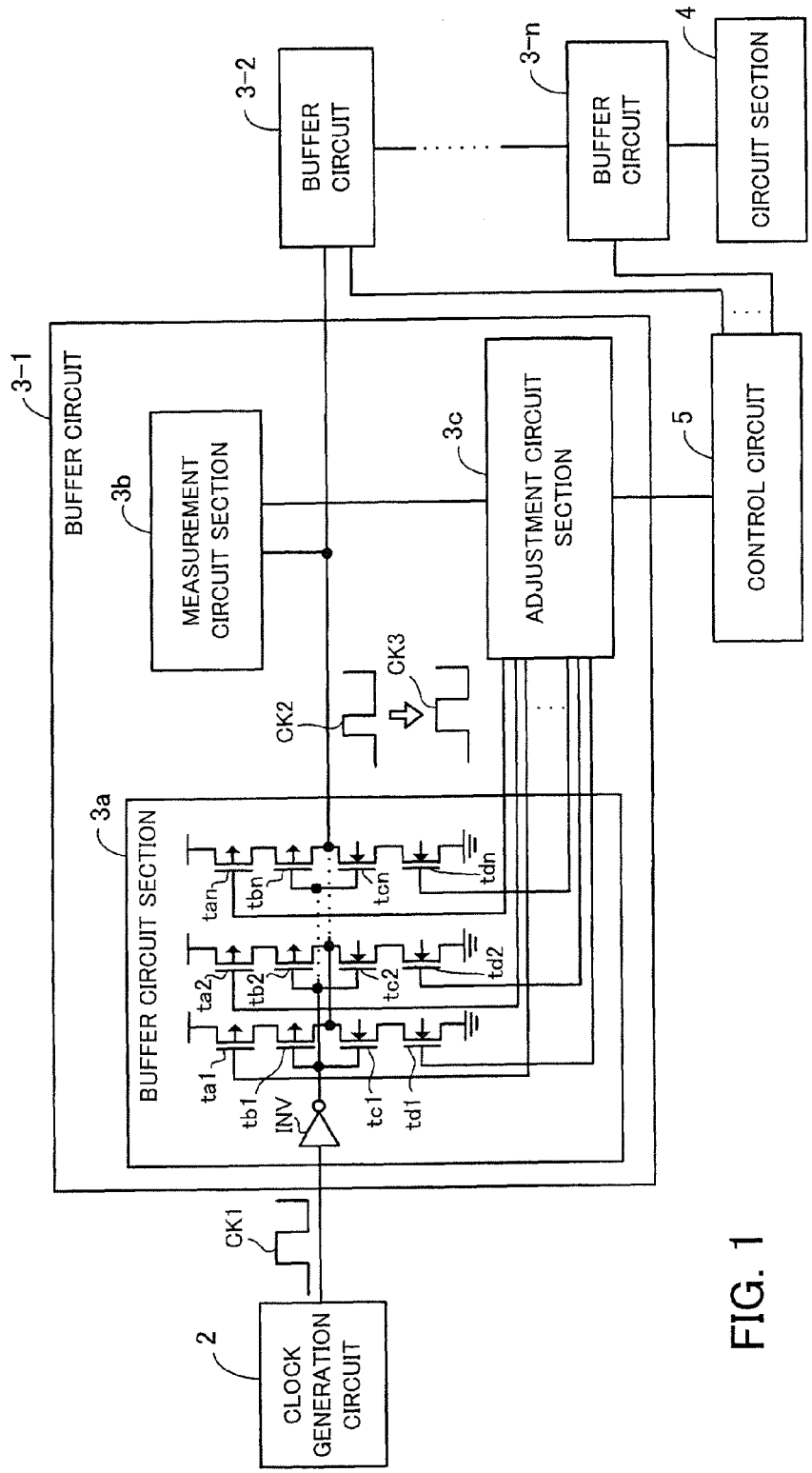
FIG. 1 illustrates an example of a semiconductor integrated circuit and a buffer circuit of a first embodiment.

Hereinafter, several embodiments will be described below in detail with reference to the accompanying drawings, wherein like reference numerals refer to like elements throughout.

First Embodiment

A semiconductor integrated circuit and a buffer circuit illustrated below prevent the duty ratio of a clock from degrading (from differing from an intended one) due to variations in the characteristics of the transistors in a buffer circuit included in a clock path. Examples of variations in the characteristics of transistors include a variation in a resistance ratio between a p-channel MOSFET (Metal-Oxide Semiconductor Field Effect Transistor) (hereinafter, abbreviated as a pMOS) and an n-channel MOSFET (hereinafter, abbreviated as an nMOS) included in the buffer circuit.

While degradation of the duty ratio of a clock becomes remarkable as the frequency of the clock is increased, the semiconductor integrated circuit and buffer circuit of the present embodiments disclosed herein suppress the degradation of the duty ratio of a propagating clock even in such a case.

FIG. 1 illustrates an example of the semiconductor integrated circuit and buffer circuit of a first embodiment.

A semiconductor integrated circuit 1 includes a clock generation circuit 2, buffer circuits 3-1, 3-2, . . . , 3-n, a circuit section 4, and a control circuit 5.

The clock generation circuit 2 generates a clock used in the semiconductor integrated circuit 1. The clock generation circuit 2 is, for example, a PLL circuit, a DLL (Delay Locked Loop) circuit, or the like which generates an internal clock based on an external reference clock. Note that the clock generation circuit 2 may be outside the semiconductor integrated circuit 1.

A plurality of stages of buffer circuits 3-1 to 3-n is provided in series in a clock path between the clock generation circuit 2 and the circuit section 4, and wave-shapes a clock to be input.

The circuit section 4 performs a predetermined operation in response to a rising or falling timing of a clock. Examples of the circuit section 4 include, for example, a high-speed interface circuit, a DDR SDRAM (Double-Data-Rate Synchronous Dynamic Random Access Memory), and the like, but needless to say, are not limited thereto.

The control circuit 5 controls the buffer circuits 3-1 to 3-n and the like.

The buffer circuit 3-1 includes a buffer circuit section 3a, a measurement circuit section 3b, and an adjustment circuit section 3c.

The buffer circuit section 3a receives a clock and wave-shapes the clock. In the example of FIG. 1, the buffer circuit section 3a includes an inverter INV, and transistors ta1, ta2, . . . , tan, tb2, tb2, . . . , tbn, tc1, tc2, . . . , tcn, and td1, td2, . . . , tdn. The transistors ta1 to tan and tb1 to tbn are pMOS's. The transistors tc1 to tcn and td1 to tdn are nMOS's.

A power supply voltage is applied to the sources of the transistors ta1 to tan, and the drains thereof are connected to the sources of the transistors tb1 to tbn. The drains of the transistors tb1 to tbn are connected to the subsequent-stage buffer circuit 3-2 and the drains of the transistors tc1 to tcn. The sources of the transistors tc1 to tcn are connected to the drains of the transistors td1 to tdn, and the sources of the transistors td1 to tdn are grounded.

Moreover, the gates of the transistors ta1 to tan and td1 to tdn are connected to the adjustment circuit section 3c, and the gates of the transistors tb1 to tbn and tc1 to tcn are connected to an output terminal of the inverter INV.

In such a buffer circuit section 3a, the transistors ta1 to tan and td1 to tdn are individually turned on or turned off by control signals from the adjustment circuit section 3c. This determines selection of whether the transistors tb1 to tbn and tc1 to tcn, which are connected to the transistors ta1 to tan and td1 to tdn, are individually activated or deactivated. A set of nMOS and pMOS transistors to be activated among the transistors tb1 to tbn and tc1 to tcn performs a function as an inverter.

Note that, in the example of FIG. 1, the inverter INV, as with the above-described buffer circuit section 3a, may include a plurality of transistors in which activation or deactivation is individually selected.

The measurement circuit section 3b measures the pulse width at an H level and the pulse width at an L level of an output clock output from the buffer circuit section 3a, and reports the measurement result to the adjustment circuit section 3c.

The adjustment circuit section 3c, based on the measurement result of the measurement circuit section 3b, varies the drive capability of the buffer circuit section 3a, and adjusts a ratio (i.e., duty ratio) of the pulse width at an H level and the pulse width at an L level of the clock. For example, the adjustment circuit section 3c, based on the measurement result of the measurement circuit section 3b, selects pMOS and nMOS transistors to be activated among the transistors tb1 to tbn which are pMOS's and the transistors tc1 to tcn which are nMOS's, thereby varying the drive capability of the buffer circuit section 3a.

Next, an example of the operation of the semiconductor integrated circuit 1 of the first embodiment is described. Note that, in the description below, description will be made assuming that other buffer circuits 3-2 to 3-n each also have a circuit similar to the buffer circuit 3-1, but at least either one of the buffer circuits 3-1 to 3-n may have each element of the buffer circuit 3-1 as illustrated in FIG. 1.

The control circuit 5 controls whether or not the adjustment circuit section 3c of the buffer circuits 3-1 to 3-n adjusts the drive capability of the buffer circuit section 3a. When a signal for instructing to adjust the drive capability of the buffer circuit section 3a is supplied from the control circuit 5 to the adjustment circuit section 3c of the buffer circuits 3-1 to 3-n, the adjustment circuit section 3c activates an arbitrary set of pMOS and nMOS transistors among the transistors tb1 to tbn and tc1 to tcn.

The buffer circuit section 3a wave-shapes an input clock CK1 with the inverter INV and inverters of a set of activated pMOS and nMOS transistors among the transistors tb1 to tbn and tc1 to tcn. At this time, an output clock of the buffer circuit section 3a is assumed to be a clock CK2 having a waveform as illustrated in FIG. 1, for example. In this clock CK2, the pulse width at an H level is shorter than the pulse width at an L level.

The measurement circuit section 3b measures the pulse width at an H level and the pulse width at an L level of the clock CK2, and reports the measurement result to the adjustment circuit section 3c. Although the detail is described later, the adjustment circuit section 3c, for example, in setting the duty ratio to 50:50, controls the transistors ta1 to tan and td1 to tdn with a control signal and changes a combination of pMOS and nMOS transistors to be activated. Then, the adjustment circuit section 3c receives the measurement result at this time from the measurement circuit section 3b, and looks for a combination of pMOS and nMOS transistors in which the duty ratio becomes closest to 50:50.

When a combination of pMOS and nMOS transistors, in which the duty ratio becomes closest to 50:50, is found, the adjustment circuit section 3c holds the value of a control signal at this time into a non-illustrated holding circuit section. When the adjustment of the drive capability of the buffer circuit section 3a is completed in this manner, the adjustment circuit section 3c sends a signal indicative of completion of the adjustment to the control circuit 5. Thus, a clock CK3 whose duty ratio is closer to 50:50 is output from the buffer circuit 3-1. The processing as described above is performed also in the buffer circuits 3-2 to 3-n, for example.

Note that, the adjustment circuit section 3c may arbitrarily change the duty ratio of the clock to 30:70, 70:30, or the like by controlling the transistors ta1 to tan and td1 to tdn with a control signal and changing a combination of pMOS and nMOS transistors to be activated.

As described above, in the semiconductor integrated circuit 1 and buffer circuit 3-1 of the present embodiment, the pulse widths on the H and L sides of a clock output from the buffer circuit section 3a are measured, and in response to the measurement result the drive capability of the buffer circuit section 3a is varied and the duty ratio of the clock is adjusted. Thus, even if the frequency of the clock is increased, the degradation of the duty ratio of the clock to be propagated may be suppressed regardless of manufacturing variations of the characteristics of transistors included in the buffer circuit section 3a. Therefore, the occurrence of a malfunction in the circuit section 4 due to input of the clock of an unintended duty ratio may be suppressed.

For example, even if the circuit section 4 is a circuit like a DDR SDRAM which uses both the rising edge and the falling edge of the clock, the occurrences of a problem that the pulse width on one of an H side and an L side narrows, which causes a trouble in setting up may be reduced.

Second Embodiment

Figure 2:
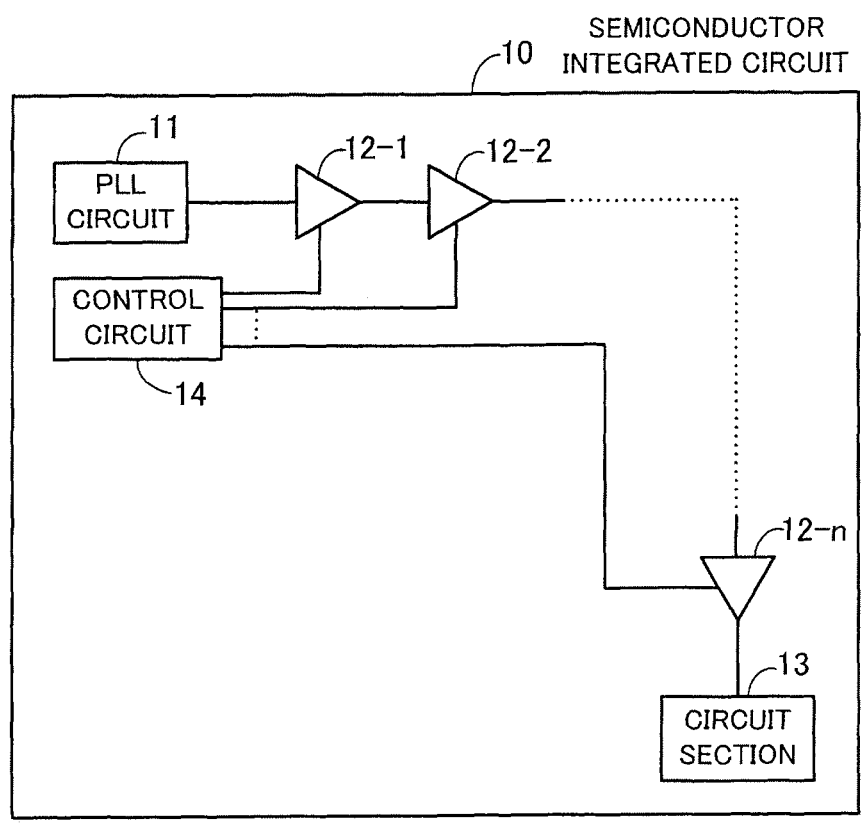
FIG. 2 illustrates an example of a semiconductor integrated circuit of a second embodiment.

FIG. 2 illustrates an example of the semiconductor integrated circuit of a second embodiment.

A semiconductor integrated circuit 10 includes a PLL circuit 11, buffer circuits 12-1, 12-2, . . . , 12-n, a circuit section 13, and a control circuit 14.

The PLL circuit 11, upon receipt of an external clock, generates a clock (internal clock) of a predetermined frequency. A plurality of stages of buffer circuits 12-1 to 12-n is provided in a clock path between the PLL circuit 11 and the circuit section 13, and wave-shapes a clock to be input. The control circuit 14 controls the buffer circuits 12-1 to 12-n and the like.

Figure 3:
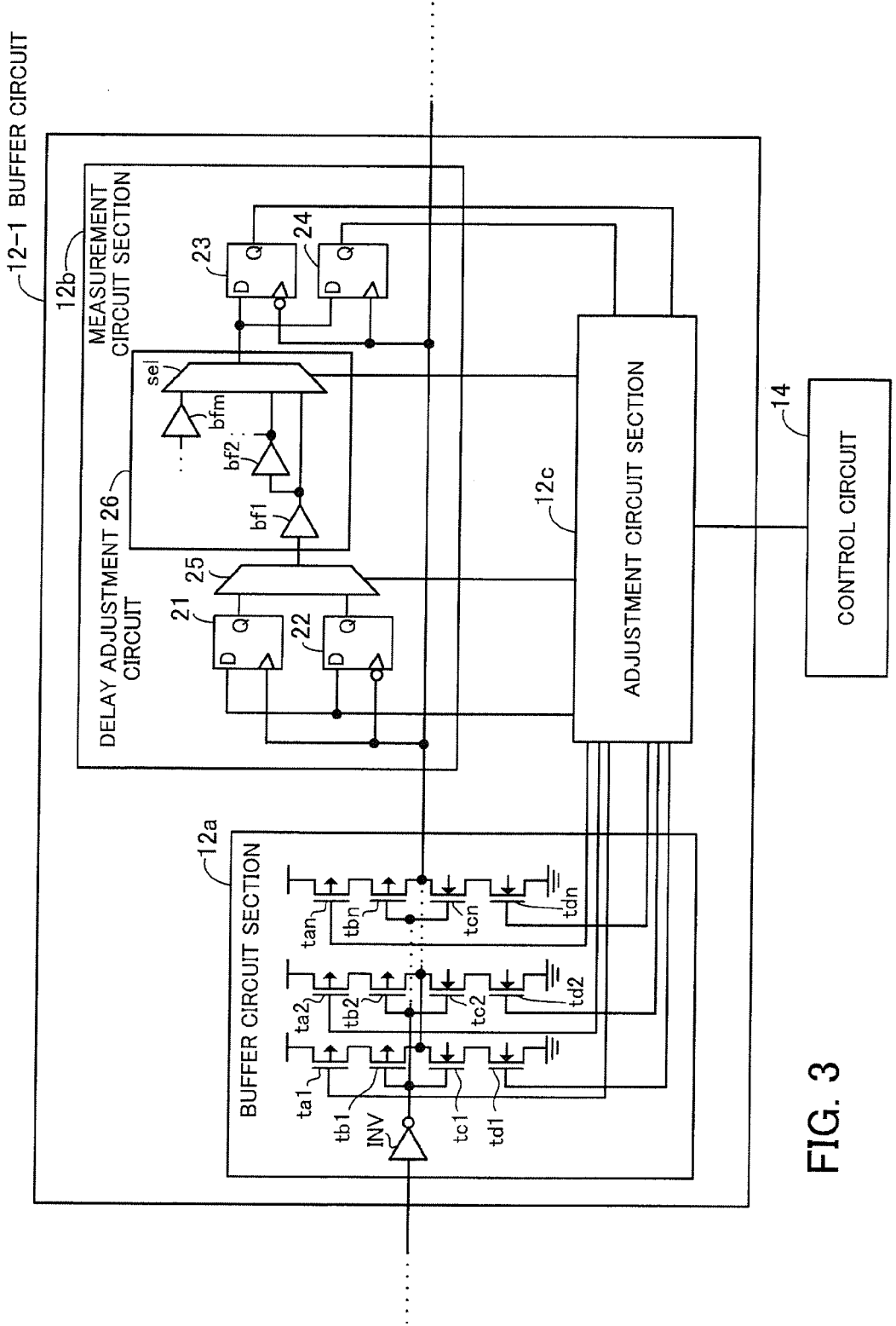
FIG. 3 illustrates an example of a buffer circuit of the second embodiment.

FIG. 3 illustrates an example of the buffer circuit of the second embodiment. In FIG. 3, although an example of the buffer circuit 12-1 illustrated in FIG. 2 is illustrated, the other buffer circuits 12-2 to 12-n may be similar circuits, and for example, the buffer circuit 12-n may be a circuit as illustrated in FIG. 3, and the others may be ordinary buffer circuits.

The buffer circuit 12-1 includes a buffer circuit section 12a, a measurement circuit section 12b, and an adjustment circuit section 12c.

The buffer circuit section 12a, in the example of FIG. 3, has the same circuit as the buffer circuit section 3a illustrated in FIG. 1.

The measurement circuit section 12b includes D type flip-flops (hereinafter, denoted by DFF's) 21, 22, 23, and 24, a selector 25, and a delay adjustment circuit 26.

A data terminal (denoted by "D" in FIG. 3) of each of DFF's 21, 22 is connected to the adjustment circuit section 12c. An output clock from the buffer circuit section 12a is input to a clock terminal of DFF 21, while an output clock from the buffer circuit section 12a is input to a clock terminal of DFF 22 with the potential level inverted. Output terminals (denoted by "Q" in FIG. 3) of DFF's 21, 22 are connected to one input terminal and another input terminal of the selector 25, respectively. The selector 25 selects and outputs either of the output signal of DFF 21 or the output signal of DFF 22 in response to a selection signal from the adjustment circuit section 12c.

The delay adjustment circuit 26 delays an output signal of the selector 25. The delay adjustment circuit 26 includes delay buffers bf1, bf2, . . . , bfm and a selector sel.

The delay buffers bf1 to bfm are connected in series, and an output terminal of each of the delay buffers bf1 to bfm is connected to either of a plurality of input terminals of the selector sel.

The selector sel has m input terminals corresponding to m delay buffers bf1 to bfm. To the m input terminals, an output signal of the selector 25 delayed by the delay buffer bf1, an output signal of the selector 25 delayed by two stages of delay buffers bf1 and bf2, . . . , an output signal of the selector 25 delayed by m stages of delay buffers bf1 to bfm are input. The selector sel selects and outputs a signal, which is input to either of the m input terminals, in response to the selection signal from the adjustment circuit section 12c.

Data terminals of DFF's 23, 24 are connected to an output terminal (i.e., an output terminal of the selector sel) of the delay adjustment circuit 26. An output clock from the buffer circuit section 12a is input to a clock terminal of DFF 23, with the potential level inverted. An output clock from the buffer circuit section 12a is input to a clock terminal of DFF 24. Output terminals of DFF's 23, 24 are connected to the adjustment circuit section 12c.

The adjustment circuit section 12c generates a control signal based on a measurement result of the measurement circuit section 12b, supplies the same to the transistors ta1 to tan and td1 to tdn of the buffer circuit section 12a, varies the drive capability of the buffer circuit section 12a, and adjusts the duty ratio of the clock.

Hereinafter, an operation example of the buffer circuit 12-1 of the second embodiment is described.

(Operation Example of Buffer Circuit 12-1)

Figure 4:
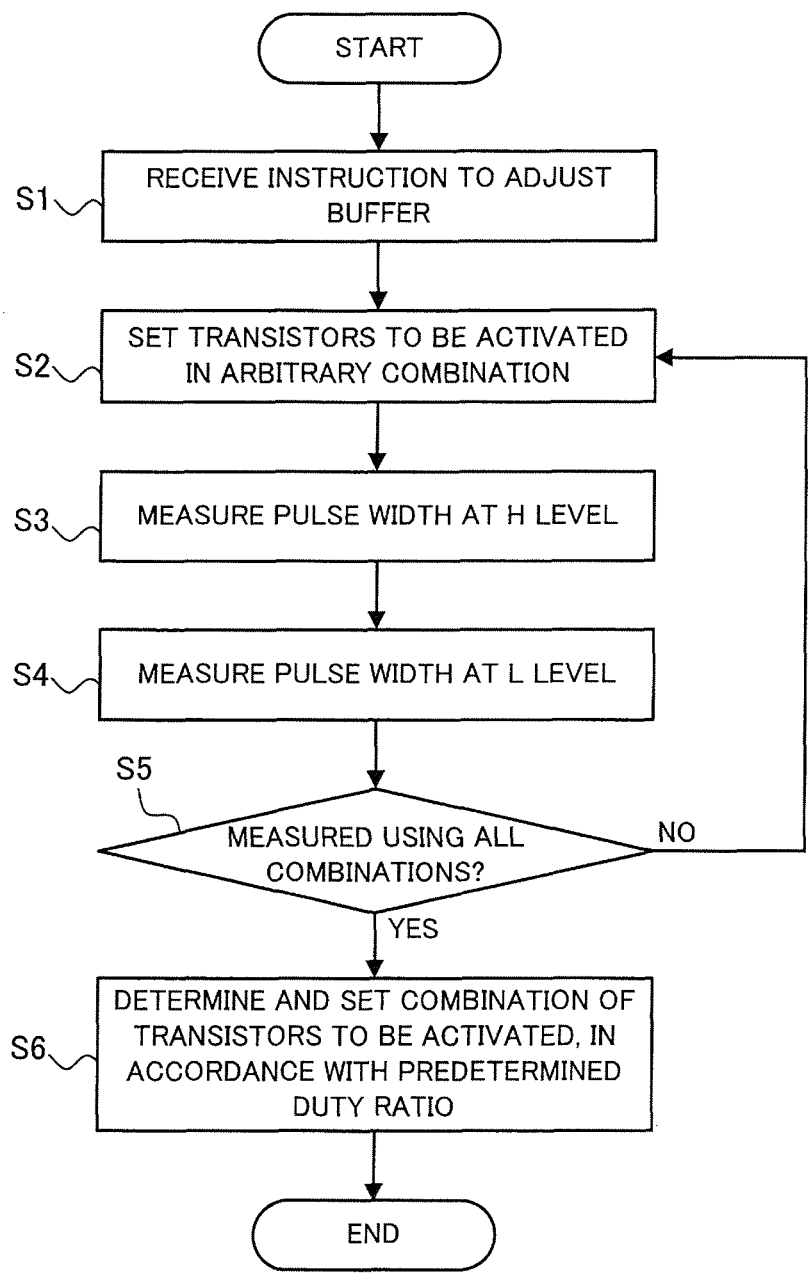
FIG. 4 is a flow chart illustrating an example of the operation of the buffer circuit of the second embodiment.

FIG. 4 is a flow chart illustrating an example of the operation of the buffer circuit of the second embodiment.

The adjustment circuit section 12c, upon receipt of an instruction to adjust the drive capability of the buffer circuit section 12a from the control circuit 14 (Step S1), sets transistors to be activated in an arbitrary combination from among the transistors tb1 to tbn and tc1 to tcn (Step S2). In the process of Step S2, the adjustment circuit section 12c sets transistors to be activated or deactivated among the transistors tb1 to tbn and tc1 to tcn by supplying an initial value of the control signal (gate voltage) to the transistors ta1 to tan and td1 to tdn.

Subsequently, under the control of the adjustment circuit section 12c, the measurement circuit section 12b measures the pulse width at an H level and the pulse width at an L level of the clock output from the buffer circuit section 12a (Steps S3, S4). Then, the adjustment circuit section 12c determines whether or not measurements using all the combinations of the transistors tb1 to tbn and tc1 to tcn are completed (Step S5). If there is any combination of remaining transistors, then in the process of Step S2, an unmeasured combination is selected and the pulse width measurement processes of Steps S3, S4 are repeated.

When the measurements using all the combinations are completed, the adjustment circuit section 12c, based on a measurement result and in response to a predetermined duty ratio, determines a combination of transistors to be activated, sets the same in the buffer circuit section 12a (Step S6), and completes the drive capability adjustment process. At this time, the adjustment circuit section 12c may report to the control circuit 14 that the adjustment of the drive capability is completed.

Note that, the order of the above-described respective steps is not limited in particular, but the order of the process of Step S3 and the process of Step S4 may be switched, for example.

Hereinafter, an example of measuring the pulse width of a clock is described.

(Example of Measurement of Pulse Width of Clock)

Figure 5:
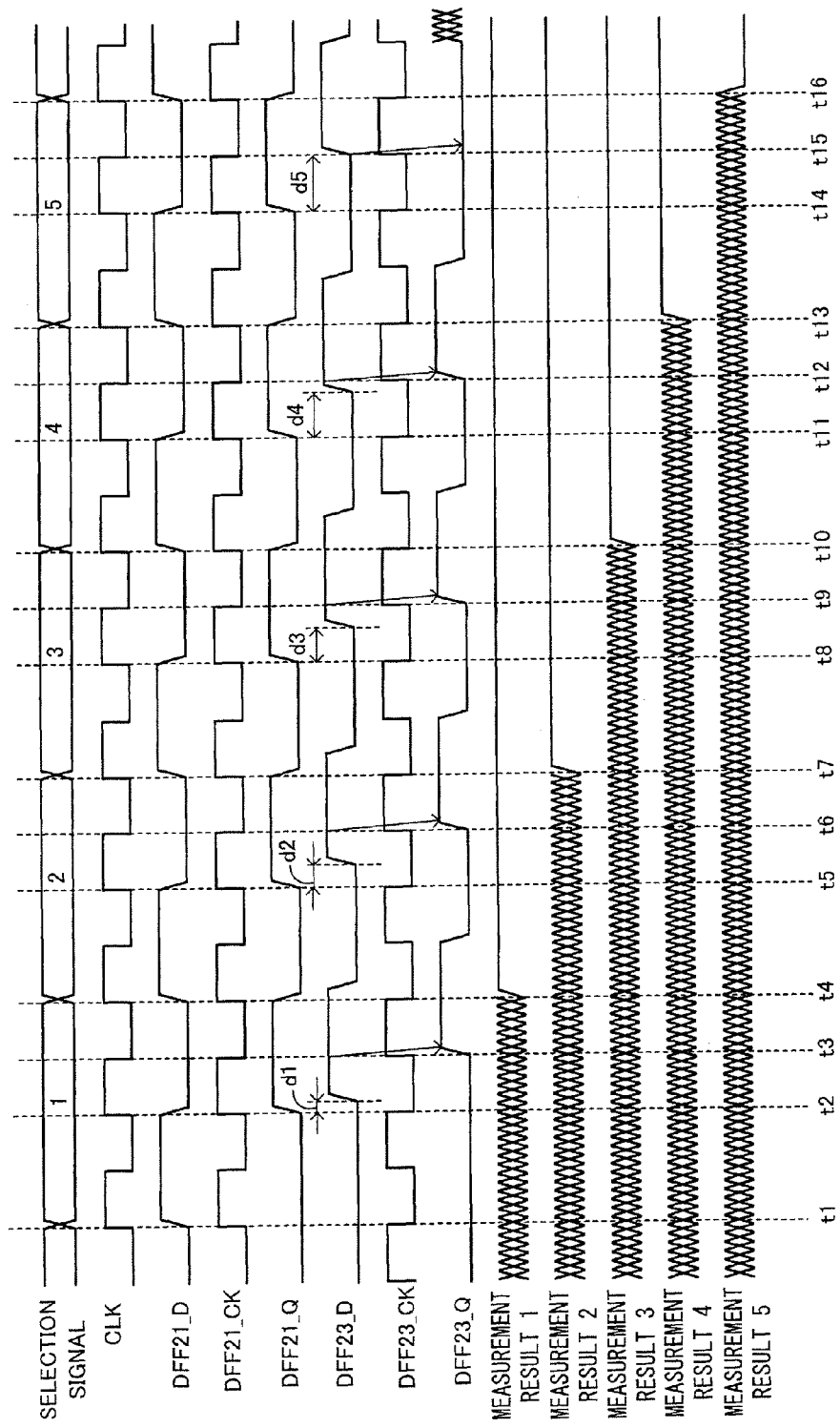
FIG. 5 is a timing chart illustrating an example of measuring the pulse width at an H level of a clock.

FIG. 5 is a timing chart illustrating an example of measuring the pulse width at an H level of the clock.

In FIG. 5, there are illustrated a plurality of bits of selection signals supplied from the adjustment circuit section 12c to the selector sel of the delay adjustment circuit 26. Moreover, there are illustrated a clock CLK to be input to the measurement circuit section 12b from the buffer circuit section 12a, and input data DFF 21_D from the adjustment circuit section 12c to DFF 21 and an input clock DFF 21_CK to DFF 21. Furthermore, there are illustrated output data DFF 21_Q of DFF 21, input data DFF 23_D and an input clock DFF 23_CK of DFF 23, output data DFF 23_Q of DFF 23, and an example of measurement results 1 to 5 which are signals generated in the adjustment circuit section 12c. Note that, in the example of FIG. 5, the input data DFF 21_D is set to a signal having a pulse width of one cycle of the clock CLK. Moreover, in the following example, the delay amounts of the respective delay buffers bf1 to bfm are assumed to be equal, but may vary from each other.

In the example illustrated in FIG. 5, at a timing t1, the selection signal becomes "1", the clock CLK rises to an H level, and the input data DFF 21_D becomes "1". At a timing t2 when the clock CLK rises to an H level next, the input data DFF 21_D is captured by DFF 21, and the output data DFF 21_Q becomes "1".

Note that, in measuring the pulse width at an H level of the clock, the adjustment circuit section 12c supplies to the selector 25 of the measurement circuit section 12b a selection signal (not illustrated) indicating that the output data DFF 21_Q of DFF 21 is selected.

When the selection signal is "1", the selector sel of the delay adjustment circuit 26 selects and outputs the output signal of one stage of delay buffer bf1. Therefore, the input data DFF 23_D of DFF 23 delays relative to the output data DFF 21_Q of DFF 21 by a delay time d1 of the delay buffer bf1.

At a timing t3 when the input clock DFF 23_CK of DFF 23, which is the clock CLK whose potential level is inverted, rises, "1" is captured by DFF 23 because the input data DFF 23_D of DFF 23 is "1". As a result, the output data DFF 23_Q becomes "1". Upon receipt of this result, the adjustment circuit section 12c sets the measurement result 1 to "1" at a timing t4 when the clock CLK rises to an H level next.

Moreover, at a timing t4, the adjustment circuit section 12c sets the selection signal supplied to the selector sel to "2" and the input data DFF 21_D to "1". Thus, at a timing t5 when the clock CLK rises to an H level, the input data DFF 21_D is captured by DFF 21 and the output data DFF 21_Q becomes "1".

When the selection signal is "2", the selector sel of the delay adjustment circuit 26 selects and outputs an output signal of two stages of delay buffers bf1 and bf2. Therefore, the input data DFF 23_D of DFF 23 delays relative to the output data DFF 21_Q of DFF 21 by a delay time d2 of two stages of delay buffers.

At a timing t6 when the input clock DFF 23_CK of DFF 23 rises, "1" is captured by DFF 23 because the input data DFF 23_D of DFF 23 is "1". As a result, the output data DFF 23_Q also becomes "1". Upon receipt of this result, the adjustment circuit section 12c sets the measurement result 2 to "1" at a timing t7 when the clock CLK rises to an H level next.

Also at the timing t7 and subsequent timings t8, t9, t10, t11, t12, t13, t14, t15, and t16, a similar process is performed. That is, the adjustment circuit section 12c increments the value of the selection signal to "3", "4", and "5", and causes the delay adjustment circuit 26 to generate a delay time d3 of three stages of delay buffers, a delay time d4 of four stages of delay buffers, and a delay time d5 of five stages of delay buffers, respectively. Also in this case, at timings t9 and t12, because the input data DFF 23_D of DFF 23 is "1", "1" is captured by DFF 23 and the output data DFF 23_Q also becomes "1". Upon receipt of this result, the adjustment circuit sections 12c sets the measurement results 3, 4 to "1" at the timings t10 and t13.

On the other hand, at a timing t15, because the input data DFF 23_D of DFF 23 is "0", "0" is captured by DFF 23 and the output data DFF 23_Q also becomes "0". Upon receipt of this result, the adjustment circuit section 12c sets the measurement result 5 to "0" at a timing t16.

Thus, the adjustment circuit section 12c detects that the pulse width at an H level of the clock CLK is equal to or greater than a delay time of four stages of delay buffers and is less than a delay time of five stages of delay buffers.

In this manner, in the measurement circuit section 12b, the pulse width at an H level is measured based on a boundary value of the delay amount of the delay buffers bf1 to bfm, which allows DFF 23 to capture the output value of DFF 21.

Figure 6:
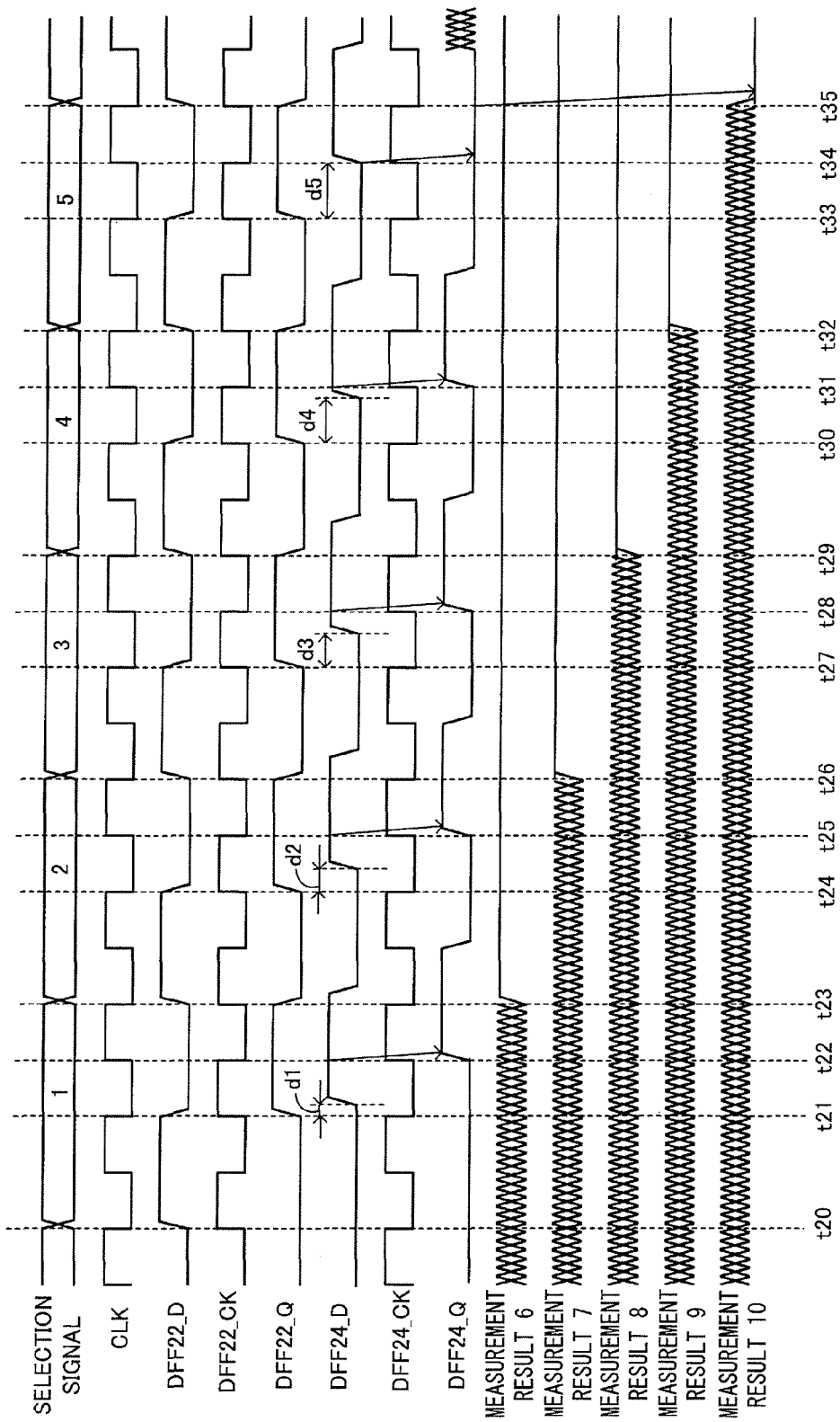
FIG. 6 is a timing chart illustrating an example of measuring the pulse width at an L level of the clock.

FIG. 6 is a timing chart illustrating an example of measuring the pulse width at an L level of the clock.

Also in FIG. 6, there is illustrated a plurality of bits of selection signals supplied to the selector sel of the delay adjustment circuit 26 from the adjustment circuit section 12c. Moreover, there are illustrated the clock CLK to be input to the measurement circuit section 12b from the buffer circuit section 12a, and input data DFF22_D from the adjustment circuit section 12c to DFF 22 and an input clock DFF 22_CK to DFF 22. Furthermore, there are illustrated output data DFF 22_Q of DFF 22, input data DFF 24_D and an input clock DFF24_CK to DFF 24, output data DFF 24_Q of DFF 24, and an example of measurement results 6 to 10 generated in the adjustment circuit section 12c. Note that, in the example of FIG. 6, the input data DFF 22_D is set to a signal having a pulse width of one cycle of the clock CLK.

In the example illustrated in FIG. 6, at a timing t20, the selection signal becomes "1", the clock CLK falls to an L level, and the input data DFF 22_D becomes "1". Note that, the input clock DFF 22_CK which is the clock CLK whose potential level is inverted is input to DFF 22. Therefore, at the timing t20, the input clock DFF 22_CK rises to an H level.

At a timing t21 when the input clock DFF 22_CK rises to an H level next, the input data DFF 22_D is captured by DFF 22 and the output data DFF 22_Q becomes "1".

Note that, in measuring the pulse width at an L level of the clock, the adjustment circuit section 12c supplies to the selector 25 of the measurement circuit section 12b a selection signal (not illustrated) indicating that the output data DFF 22_Q of DFF 22 is selected.

As described above, when the selection signal is "1", the selector sel of the delay adjustment circuit 26 selects and outputs the output signal of one stage of delay buffer bf1. Therefore, the input data DFF 24_D of DFF 24 delays relative to the output data DFF 22_Q of DFF 22 by the delay time d1 of the delay buffer bf1.

At a timing t22 when the input clock DFF24_CK of DFF 24 rises to the same potential level as the clock CLK, because the input data DFF 24_D of DFF 24 is "1", "1" is captured by DFF 24 and the output data DFF 24_Q becomes "1". Upon receipt of this result, the adjustment circuit section 12c sets the measurement result 6 to "1" at a timing t23 when the clock CLK falls to an L level next.

Also at the timing t23 and subsequent timings t24, t25, t26, t27, t28, t29, t30, t31, t32, t33, t34, and t35, a similar process is performed. That is, the adjustment circuit section 12c increments the value of the selection signal to "2", "3", "4", and "5" and causes the delay adjustment circuit 26 to generate the delay time d2 of two stages of delay buffers, the delay time d3 of three stages of delay buffers, the delay time d4 of four stages of delay buffers, and the delay time d5 of five stages of delay buffers, respectively. Also in this case, at the timings t25, t28, and t31, because the input data DFF 24_D of DFF 24 is "1", "1" is captured by DFF 24 and the output data DFF 24_Q also becomes "1". Upon receipt of this result, the adjustment circuit section 12c sets the measurement results 7, 8, and 9 to "1" at the timings t26, t29, and t32.

On the other hand, at the timing t34, because the input data DFF 24_D of DFF 24 is "0", "0" is captured by DFF 24 and the output data DFF 24_Q also becomes "0". Upon receipt of this result, the adjustment circuit section 12c sets the measurement result 10 to "0" at the timing t35.

Thus, the adjustment circuit section 12c detects that the pulse width at an L level of the clock CLK is equal to or greater than the delay time of four stages of delay buffers and is less than the delay time of five stages of delay buffers.

In this manner, in the measurement circuit section 12b, the pulse width at an L level is measured based on a boundary value of the delay amount of the delay buffers bf1 to bfm, which allows DFF 24 to capture the output value of DFF 22.

Note that, as described above, both when the pulse width at an H level of the clock is measured and when the pulse width at an L level is measured, the delay buffers bf1 to bfm of the same delay adjustment circuit 26 are used. Therefore, even if there are variations in delay time of the respective delay buffers bf1 to bfm, the same effect will occur both during measurement of the pulse width at an H level and during measurement of the pulse width at an L level. Accordingly, in adjusting the duty ratio of the clock, because the pulse width at an H level and the pulse width at an L level, which were measured under the influence of the same variation, are used, the degradation of adjustment accuracy of the duty ratio of the clock due to the above-described variation may be suppressed.

Next, an example of a code describing the operation of the adjustment circuit section 12c in the second embodiment is illustrated.

(Example of Code Describing Operation of Adjustment Circuit Section 30c)

FIG. 7 illustrates an example of a code describing the operation of the adjustment circuit section. The adjustment circuit section 12c, for example, includes a control unit, such as a CPU (Central Processing Unit), and adjusts the pulse width at an H level and the pulse width at an L level of the clock by executing the code (software) as illustrated in FIG. 7. Note that the adjustment circuit section 12c may be a circuit which performs a process of description as illustrated in FIG. 7.

In the first to third lines, the initial values of variables curmindiff, pchmindiff, and nchmindiff are given.

The variable curmindiff is a variable into which the minimum value of a difference between the pulse width at an H level and the pulse width at an L level of the clock is substituted. In the example illustrated in FIG. 7, the difference between the pulse width at an H level and the pulse width at an L level is expressed with the number of stages of the delay buffers bf1 to bfm of the above-described delay adjustment circuit 26, and the initial value of the variable curmindiff is a total number of stages of delay buffers (=m)+1.

The variable pchmindiff is a variable which holds the configuration information on a control signal (gate voltage level) to the transistors ta1 to tan of the buffer circuit section 12a when the difference between the pulse width at an H level and the pulse width at an L level of the clock is the minimum. The initial value of the variable pchmindiff is "0". In FIG. 7, the control signal supplied to the transistors ta1 to tan from the adjustment circuit section 12c is denoted by pch1_en, pch2_en, ..., pchN_en. Moreover, N bit configuration information by the control signals pch1_en to pchN_en is denoted by {pchN_en, ..., pch2_en, pch1_en}.

The variable nchmindiff is a variable which holds the configuration information on a control signal (gate voltage level) to the transistors td1 to tdn of the buffer circuit section 12a when the difference between the pulse width at an H level and the pulse width at an L level of the clock is the minimum. The initial value of the variable nchmindiff is 0. In FIG. 7, the control signal supplied to the transistors td1 to tdn from the adjustment circuit section 12c is denoted by nch1_en, nch2_en, ..., nchN_en. Moreover, N bit configuration information of the control signals nch1_en to nchN_en is denoted by {nchN_en, ..., nch2_en, nch1_en}.

In the fourth line, the configuration information {pchN_en, ..., pch2_en, pch1_en} is initialized to "1" (e.g., {0001} in the case of N=4 bits).

In this case, because the transistor ta1 of the buffer circuit section 12a illustrated in FIG. 3 is turned off and the transistors ta2 to tan are turned on, the transistor tb1 is deactivated and the transistors tb2 to tbn are activated.

Subsequently, until a relationship of {pchN_en, ..., pch2_en, pch1_en}<$2^N$ is not satisfied, the value of the configuration information {pchN_en, ..., pch2_en, pch1_en} is incremented and the processes of the following lines 5 to 15 are repeated.

In the fifth line, the configuration information {nchN_en, ..., nch2_en, nch1_en} is initialized to "1".

In this case, because the transistor td1 of the buffer circuit section 12a illustrated in FIG. 3 is turned on and the transistors td2 to tdn are turned off, the transistor tc1 is activated and the transistors tc2 to tcn are deactivated.

Through the initialization of the configuration information {pchN_en, ..., pch2_en, pch1_en} and {nchN_en, ..., nch2_en, nch1_en} as described above, the process of Step S2 illustrated in FIG. 4 is performed.

Subsequently, until a relationship of {nchN_en, ..., nch2_en, nch1_en}<$2^N$ is not satisfied, the value of the configuration information {nchN_en, ..., nch2_en, nch1_en} is incremented and the processes of the following lines 6 to 14 are repeated.

In the sixth to eighth lines, the variables hpwidth and lpwidth are updated based on a measurement result obtained in measuring the pulse width of the clock output from the buffer circuit section 12a, whose drive capability is set by a control signal corresponding to the value of the above-described configuration information.

A measurement value of the pulse width at an H level (High Pulse width) of the clock is substituted into the variable hpwidth, and a measurement value of the pulse width at an L level (Low Pulse width) of the clock is substituted into the variable lpwidth. The measurement value of the pulse width is expressed in the number of stages of the delay buffers bf1 to bfm, for example.

Then, in the ninth line, it is determined whether or not a difference (|hpwidth−lpwidth|) between the pulse width at an H level and the pulse width at an L level of the clock is smaller than the value of the variable curmindiff. Then, if (|hpwidth−lpwidth|<curmindiff, then |hpwidth−lpwidth| is substituted into the variable curmindiff as illustrated in the tenth line. Moreover, as illustrated in the eleventh line, the variable pchmindiff holds a value of the current configuration information {pchN_en, ..., pch2_en, pch1_en}. Moreover, as illustrated in the twelfth line, the variable nchmindiff holds a value of the current configuration information {nchN_en, ..., nch2_en, nch1_en}.

If {pchN_en, ..., pch2_en, pch1_en}=$2^N$ (when the measurement using all the combinations of the transistors tb1 to tbn and tc1 to tcn are completed), the processes of the sixteenth and seventeenth lines are performed. In the sixteenth line, the processing of {pchN_en, ..., pch2_en, pch1_en}=pchmindiff is performed and the value held in the variable pchmindiff is substituted into the configuration information {pchN_en, ..., pch2_en, pch1_en}. In the seventeenth line, the processing of {nchN_en, ..., nch2_en, nch1_en}=pchmindiff is performed and the value held in the variable nchmindiff is substituted into the configuration information {nchN_en, ..., nch2_en, nch1_en}.

Through the processes as described above, the values of the control signals pch1_en to pchN_en and nch1_en to nchN_en when the difference between the pulse width at an H level and the pulse width at an L level of the clock is the minimum are calculated, and supplied to the buffer circuit section 3a. Thus, from the buffer circuit section 3a, a clock whose duty ratio is closer to 50:50 is output.

Note that, the duty ratio is not limited to 50:50, but may be arbitrarily set by changing the configuration information obtained in the sixteenth and seventeenth lines of FIG. 7. For example, when the duty ratio is set to 30:70, the number of "1" currently set by the control signal pch1_en to pchN_en of the configuration information may be reduced to ⅗, and the number of "1" currently set by the control signal nch1_en to nchN_en may be increased by ⅖.

As described above, in the semiconductor integrated circuit 10 and buffer circuit 12-1 of the present embodiment, the pulse widths on the H side and L side of the clock output from the buffer circuit section 12a are measured, and in response to the measurement result the drive capability of the buffer circuit section 12a is varied and the duty ratio of the clock is adjusted. Thus, even if the frequency of the clock is increased, the degradation of the duty ratio of the clock to be propagated may be suppressed regardless of manufacturing variations of the characteristics of the transistors included in the buffer circuit section 12a. Therefore, the occurrence of a malfunction in the circuit section 13 due to input of the clock of an unintended duty ratio may be suppressed.

Figure 8A:
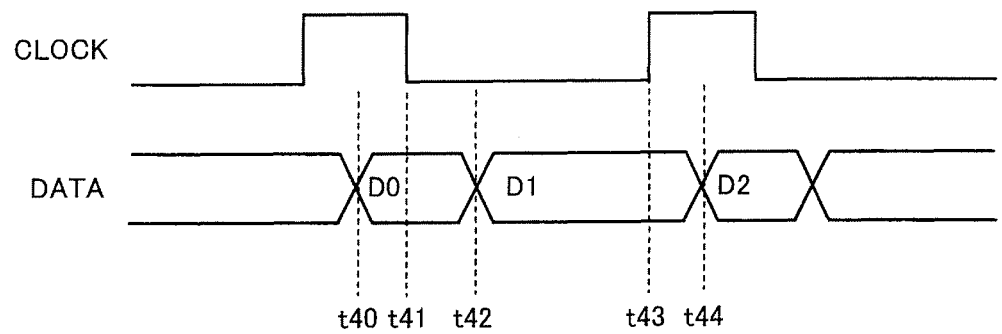
FIGS. 8A and 8B illustrate examples of the effect obtained by using the semiconductor integrated circuit and buffer circuit of the present embodiment.
Figure 8B:
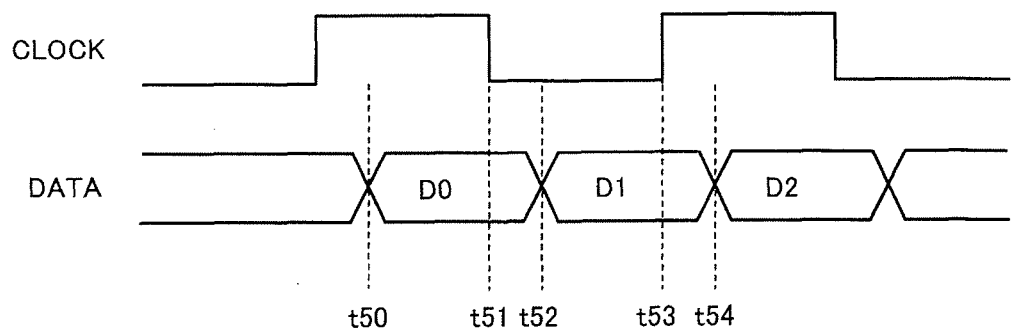

FIGS. 8A and 8B illustrate examples of the effect obtained by using the semiconductor integrated circuit and buffer circuit of the present embodiment. Here, there are illustrated how a clock which was output with a duty ratio of 50:50 from the PLL circuit 11 has arrived at the circuit section 13, and an example of data captured by the circuit section 13. FIG. 8A illustrates an example of data capturing when the duty ratio of the clock is degraded, and FIG. 8B is the view illustrating an example of data capturing with a clock whose duty ratio is adjusted by the buffer circuit 12-1 of the present embodiment. Note that, in the examples of FIGS. 8A and 8B, the circuit section 13 is assumed to be a circuit like a DDR SDRAM which uses both the rising edge and falling edge of the clock.

In FIG. 8A, data D0 is input at a timing t40, and the next data D1 is input at a timing t42 after a hold time from a falling timing t41 of the clock. Moreover, the next data D2 is input at a timing t44 after a hold time from a rising timing t43 of the clock.

With regard to the clock illustrated in FIG. 8A, the duty ratio degrades from 50:50, and when the clock arrives at the circuit section 13, the pulse width at an H level is short as compared with the pulse width at an L level. Such phenomenon occurs, for example, when resistance ratios of nMOS and pMOS transistors in the clock buffer do not match with each other and the resistance on the nMOS side is large.

When such phenomenon occurs, a time period between timings t40 to t41 for setup becomes shorter than a time period between timings t42 to t43, and a setup margin in capturing data at the falling edge will decrease. In this case, there is a possibility that the circuit section 13 does not capture data D0 properly.

On the other hand, in the buffer circuit 12-1 of the present embodiment, because the duty ratio of the clock may be adjusted so as to be 50:50, the clock as illustrated in FIG. 8B may be supplied to the circuit section 13.

In FIG. 8B, the data D0 is input at a timing t50, and the next data D1 is input at a timing t52 after a hold time from a falling timing t51 of the clock. Moreover, the next data D2 is input at a timing t54 after a hold time from a rising timing t53 of the clock.

In the example of FIG. 8B, a time period from the timing t50 when the data D0 is input to the falling timing t51 of the clock is equal to a time period from the timing t52 when the data D1 is input to the rising timing t53 of the clock. Therefore, the circuit section 13 may appropriately secure a setup margin in capturing the data D0 and D1 at both the rising edge and the falling edge of the clock, and occurrence of the problem that the data is unable to be captured is suppressed.

Moreover, in the buffer circuit 12-1 of the semiconductor integrated circuit 10 of the second embodiment, because the duty ratio of the clock may be adjusted without using an analog PLL circuit or the like, an increase in the circuit area may be suppressed.

Third Embodiment

Figure 9:
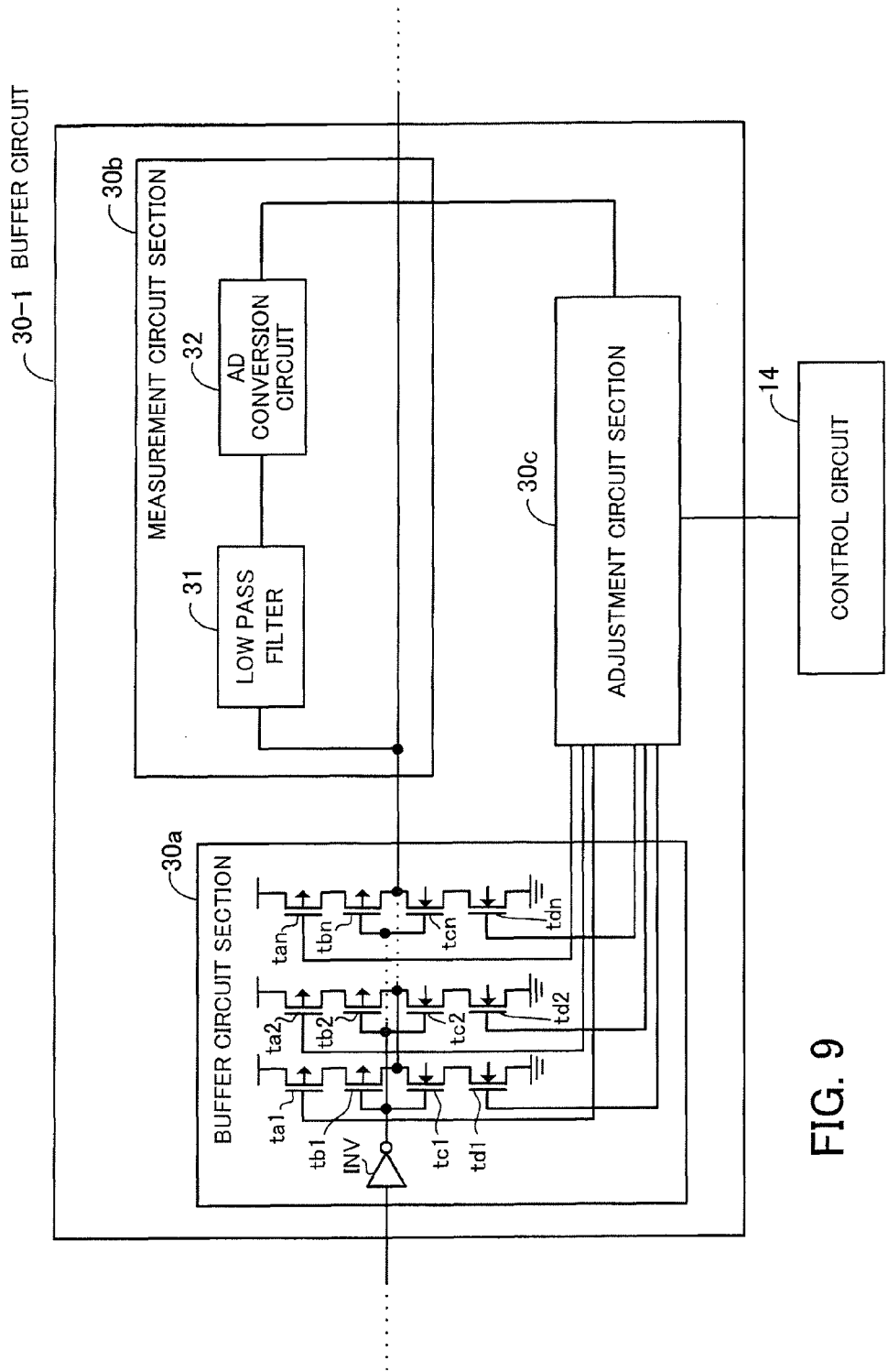
FIG. 9 illustrates an example of a buffer circuit of a third embodiment.

FIG. 9 illustrates an example of the buffer circuit of a third embodiment.

A buffer circuit 30-1 of FIG. 9 illustrates another example of the buffer circuit 12-1 illustrated in FIG. 3. Each of the buffer circuits 12-2 to 12-n illustrated in FIG. 2 may be also a circuit similar to the buffer circuit 30-1.

The buffer circuit 30-1 includes a buffer circuit section 30a, a measurement circuit section 30b, and an adjustment circuit section 30c.

The buffer circuit section 30a, in the example of FIG. 9, has the same circuit as the buffer circuit section 3a and buffer circuit section 12a illustrated in FIG. 1 and FIG. 3.

The measurement circuit section 30b, unlike the buffer circuit 12-1 of the second embodiment, includes a low pass filter 31 and an AD (Analogue to Digital) conversion circuit 32.

The low pass filter 31 receives a clock output from the buffer circuit section 30a, and outputs a voltage corresponding to a ratio between the pulse width at an H level and the pulse width at an L level of the clock.

The AD conversion circuit 32 converts an output signal of the low pass filter 31 to a digital value, and supplies the same to the adjustment circuit section 30c.

The adjustment circuit section 30c holds, as an ideal value, an AD conversion value which is the value of "the output value of the AD conversion circuit 32 at the time of a predetermined target duty ratio−VDD (power supply voltage)/2". Then, the adjustment circuit section 30c generates a control signal corresponding to a comparison result of the ideal value and a value of "the output value of the AD conversion circuit 32 corresponding to the pulse width of the clock by the measurement circuit section 30b−VDD (power supply voltage)/2", and supplies the same to the transistors ta1 to tan and td1 to tdn of the buffer circuit section 30a. Note that the reason why VDD/2 is subtracted from the output value of the AD conversion circuit 32 is for excluding a negative value and sampling a positive value.

Hereinafter, an operation example of the buffer circuit 30-1 of the third embodiment is described.

(Operation Example of Buffer Circuit 30-1)

Figure 10:
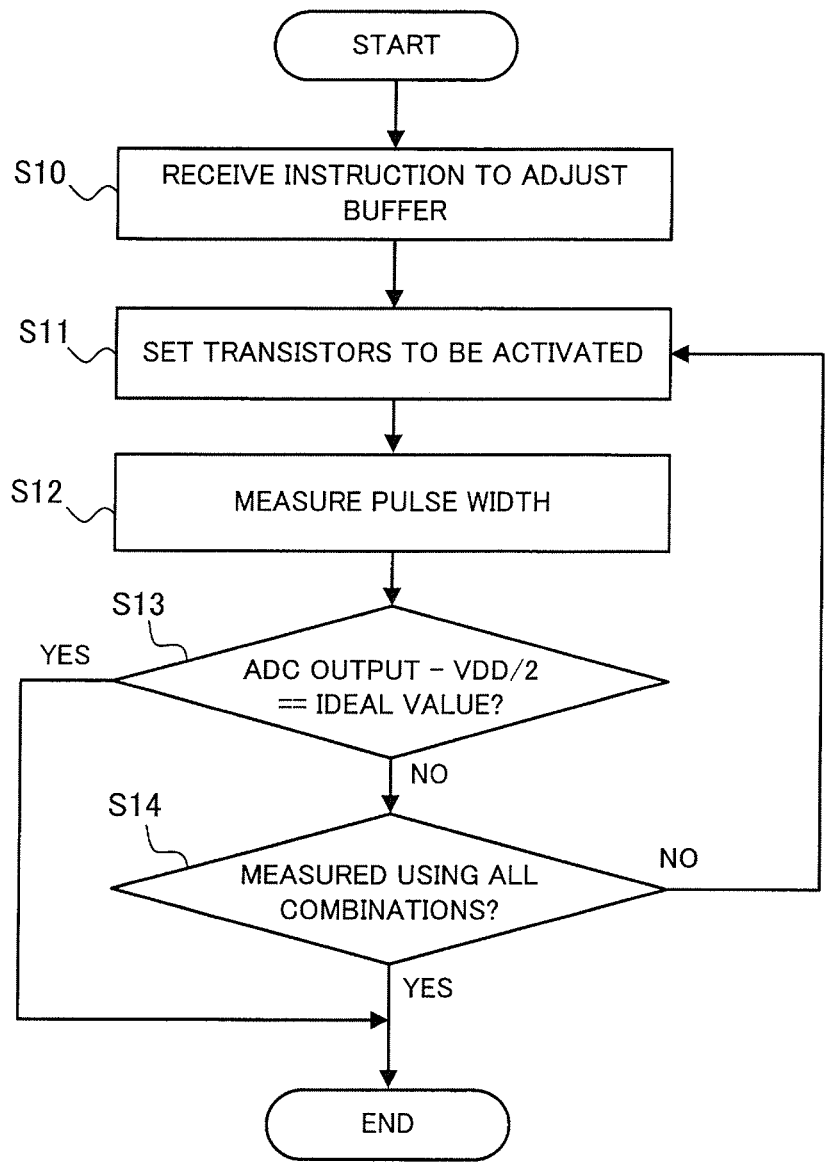
FIG. 10 is a flow chart illustrating an example of the operation of the buffer circuit of the third embodiment.

FIG. 10 is a flow chart illustrating an example of the operation of the buffer circuit of the third embodiment.

The adjustment circuit section 30c, upon receipt of an instruction to adjust the drive capability of the buffer circuit section 30a from the control circuit 14 (Step S10), sets transistors to be activated from among the transistors tb1 to tbn and tc1 to tcn (Step S11). In the process of Step S11, the adjustment circuit section 30c sets transistors to be activated or deactivated among the transistors tb1 to tbn and tc1 to tcn by supplying an initial value of the control signal (gate voltage) to the transistors ta1 to tan and td1 to tdn.

Subsequently, in the process of Step S12, the measurement circuit section 30b measures a pulse width (in the example of FIG. 9, the output value of the measurement circuit section 30b will be a value corresponding to a ratio between the pulse width at an H level and the pulse width at an L level). The adjustment circuit section 30c, based on a measurement result, determines whether or not "the output value (ADC output) of the AD conversion circuit 32−VDD/2" matches with the ideal value (Step S13). If "ADC output−VDD/2" matches with the ideal value, the adjustment of the drive capability is completed. At this time, the adjustment circuit section 30c may report to the control circuit 14 that the adjustment of the drive capability is completed.

If "ADC output−VDD/2" does not match with the ideal value, the adjustment circuit section 30c determines whether or not measurements using all the combinations of the transistors tb1 to tbn and tc1 to tcn are completed (Step S14). If there is any combination of remaining transistors, then in Step S11, an unmeasured combination is selected and the processes of Steps S12 and S13 are repeated.

When the measurements using all the combinations are completed, the process of adjusting the drive capability is completed. At this time, the adjustment circuit section 30c may supply to the buffer circuit section 30a a control signal obtained when a measurement result closest to the ideal value is obtained, at a time point when the measurements using all the combinations of the transistors tb1 to tbn and tc1 to tcn are completed.

Hereinafter, an example of measuring and adjusting the pulse width of the clock by the measurement circuit section 30b and the adjustment circuit section 30c is described. Note that, in the following, a case is described where the duty ratio of the clock is adjusted to 50:50.

(Example of Measurement/Adjustment of Pulse Width of Clock)

Figure 11:
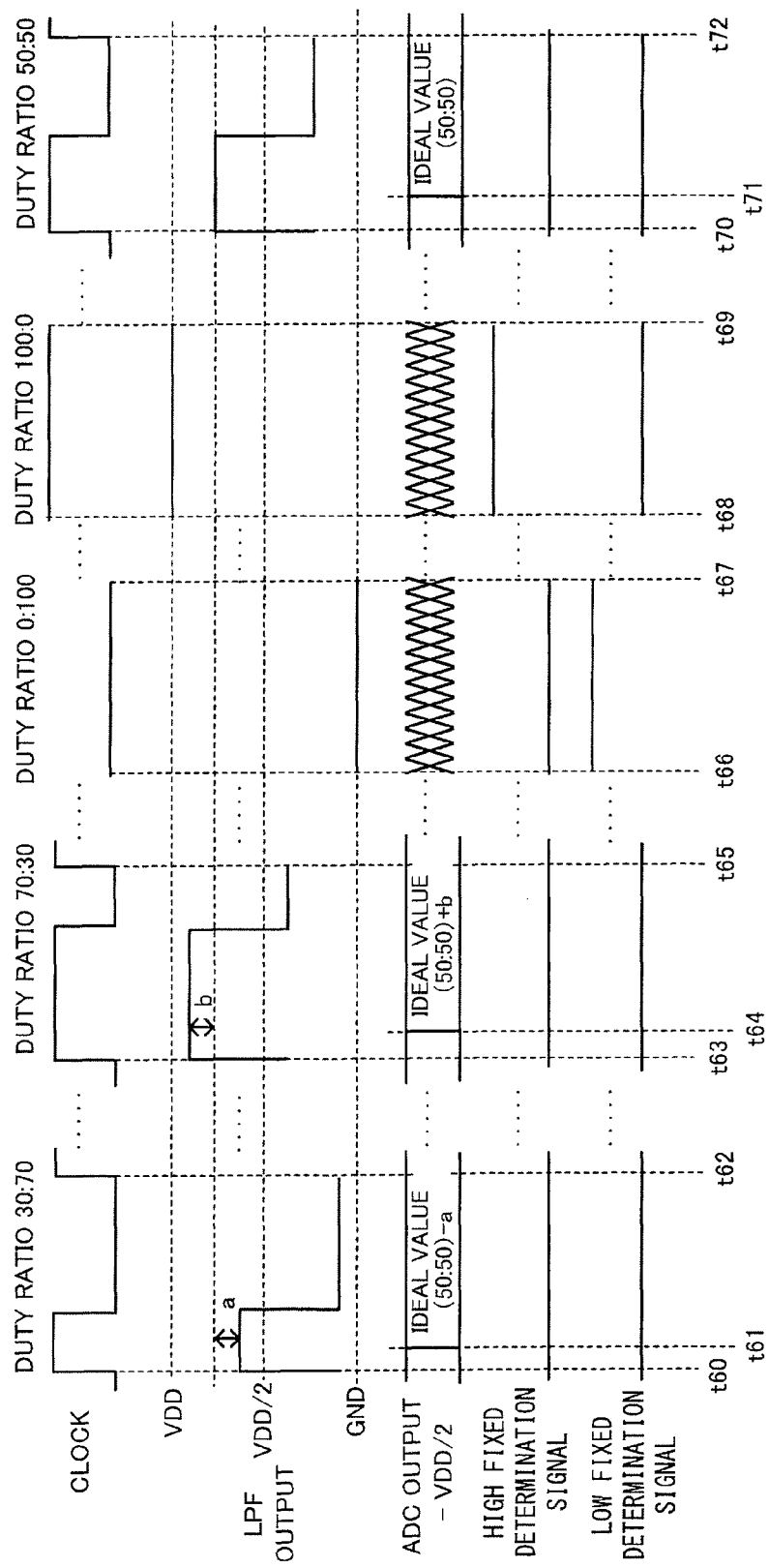
FIG. 11 is a timing chart illustrating an example of measuring and adjusting the pulse width of a clock.

FIG. 11 is a timing chart illustrating an example of measuring and adjusting the pulse width of a clock. There are illustrated an example of the clock, the output signal (LPF output) of the low pass filter 31, the "ADC output−VDD/2", a High fixed determination signal, and a Low fixed determination signal. Note that, the High fixed determination signal is a signal, which becomes "1" when the input of the AD conversion circuit 32 is fixed to VDD for a predetermined period, and is output from the AD conversion circuit 32. Moreover, the Low fixed determination signal is a signal, which becomes "1" when the input of the AD conversion circuit 32 is fixed to GND (earth potential) for a predetermined period, and is output from the AD conversion circuit 32.

At timings t60 to t62, a case is illustrated where the clock whose duty ratio is 30:70 is input to the low pass filter 31. In this case, an output signal of the low pass filter 31 is smaller by a value "a" than an output signal of the low pass filter 31 when the duty ratio of the clock is 50:50. Accordingly, "ADC output−VDD/2" also becomes smaller by the value "a" than the ideal value when the duty ratio of the clock is 50:50 (at a timing t61).

In such a case, the adjustment circuit section 30c, for example, performs the process of Step S13 to the process of Step S14 illustrated in FIG. 10, and returns to the process of Step S11 and tries another combination of the transistors tb1 to tbn and tc1 to tcn.

Note that, when the duty ratio is 30:70, the adjustment circuit section 30c supplies a control signal, which reduces the pMOS resistance among the pMOS resistance and nMOS resistance of the buffer circuit section 30a, to the buffer circuit section 30a, thereby allowing "ADC output−VDD/2" to approach the ideal value. In order to reduce the pMOS resistance of the buffer circuit section 30a, the number of transistors to be turned on among the transistors ta1 to tan may be reduced.

At timings t63 to t65, a case is illustrated where the clock whose duty ratio is 70:30 is input to the low pass filter 31. In this case, the output signal of the low pass filter 31 is larger by a value "b" than the output signal of the low pass filter 31 when the duty ratio of the clock is 50:50. Accordingly, "ADC output−VDD/2" also becomes larger by the value "b" than the ideal value when the duty ratio of the clock is 50:50 (at a timing t64).

In such a case, the adjustment circuit section 30c, for example, performs the process of Step S13 to the process of Step S14 illustrated in FIG. 10, and returns to the process of Step S11 and tries another combination of the transistors tb1 to tbn and tc1 to tcn.

Note that, when the duty ratio is 70:30, the adjustment circuit section 30c supplies a control signal, which reduces the nMOS resistance among the pMOS resistance and nMOS resistance of the buffer circuit section 30a, to the buffer circuit section 30a, thereby allowing "ADC output−VDD/2" to approach the ideal value. In order to reduce the pMOS resistance of the buffer circuit section 30a, the number of transistors to be turned on among the transistors td1 to tdn may be reduced.

At timings t66 to t67, a case is illustrated where the clock whose duty ratio is 0:100 is input to the low pass filter 31. In this case, the output signal of the low pass filter 31 is fixed to GND. At this time, although "ADC output−VDD/2" becomes uncertain, the AD conversion circuit 32 sets the Low fixed determination signal to "1".

The adjustment circuit section 30c, upon receipt of the Low fixed determination signal of "1", returns to the process of Step S11 and tries another combination of the transistors tb1 to tbn and tc1 to tcn.

Note that, when the duty ratio is 0:100, the adjustment circuit section 30c supplies a control signal, which reduces the pMOS resistance among the pMOS resistance and nMOS resistance of the buffer circuit section 30a, to the buffer circuit section 30a, thereby allowing "ADC output−VDD/2" to approach the ideal value.

At timings t68 to t69, a case is illustrated where the clock whose duty ratio is 100:0 is input to the low pass filter 31. In this case, the output signal of the low pass filter 31 is fixed to VDD. At this time, although "ADC output−VDD/2" becomes uncertain, the AD conversion circuit 32 sets the High fixed determination signal to "1".

The adjustment circuit section 30c, upon receipt of the High fixed determination signal of "1", returns to the process of Step S11 and tries another combination of the transistors tb1 to tbn and tc1 to tcn.

Note that, when the duty ratio is 100:0, the adjustment circuit section 30c supplies a control signal, which reduces the nMOS resistance among the pMOS resistance and nMOS resistance of the buffer circuit section 30a, to the buffer circuit section 30a, thereby allowing "ADC output−VDD/2" to approach the ideal value.

At timings t70 to t72, a case is illustrated where the clock whose duty ratio is 50:50 is input to the low pass filter 31. In this case, "ADC output−VDD/2" matches with the ideal value (at the timing t71).

In such a case, the adjustment circuit section 30c terminates the process of adjusting the drive capability of the buffer circuit section 30a.

Next, an example of a code describing the operation of the adjustment circuit section 30c in the third embodiment is illustrated.

(Example of Code Describing Operation of Adjustment Circuit Section 30c)

FIG. 12 illustrates an example of the code describing the operation of the adjustment circuit section. For the same element as in the code illustrated in FIG. 7, the same symbol is used and thus the description thereof is omitted.

The adjustment circuit section 30c, for example, includes a control circuit section, such as a CPU, and executes the code (software) as illustrated in FIG. 12, thereby adjusting the pulse width at an H level and the pulse width at an L level of a clock. Note that the adjustment circuit section 30c may be a circuit which performs a process of description as illustrated in FIG. 12.

In the first line, configuration information {pchN_en, . . . , pch2_en, pch1_en} is initialized to "1". Subsequently, until a relationship of {pchN_en, . . . , pch2_en, pch1_en}<$2^N$ is not satisfied, the value of the configuration information {pchN_en, . . . , pch2_en, pch1_en} is incremented and the processes of the following lines 2 to 7 are repeated.

In the third line, configuration information {nchN_en, . . . , nch2_en, nch1_en} is initialized to "1". Subsequently, until a relationship of {nchN_en, . . . , nch2_en, nch1_en}<$2^N$ is not satisfied, the value of the configuration information {nchN_en, . . . , nch2_en, nch1_en} is incremented and the processes of the following lines 3 to 6 are repeated.

In the third to sixth lines, based on a measurement result obtained by measuring the pulse width corresponding to the value of the above-described configuration information, it is determined whether or not "ADC output−VDD/2" matches with the ideal value (50:50) when the duty ratio is 50:50. If "ADC output−VDD/2"=ideal value (50:50), then "exit" is executed and the process is completed.

As described above, in the buffer circuit 30-1 of the third embodiment, the duty ratio of the clock is adjusted by varying the drive capability of the buffer circuit section 30a in response to a ratio between a pulse width on the H side and a pulse width on the L side of the clock output from the buffer circuit section 30a. Thus, even if the frequency of the clock is increased, the degradation of the duty ratio of the clock to be propagated may be suppressed regardless of manufacturing variations of the characteristics of the transistors included in the buffer circuit section 30a. Therefore, the occurrence of a malfunction in the circuit section 13 due to input of a clock of an unintended duty ratio may be suppressed.

In the foregoing, one aspect of the buffer circuit and semiconductor integrated circuit of the embodiments disclosed herein have been described based on the embodiments, but these are just one example, and are not limited to the above-described ones.

For example, the control circuits 5 and 14, upon receipt of the measurement results of the measurement circuit sections 3b, 12b, and 30b, may enable the functions of the adjustment circuit sections 3c, 12c, and 30c if the duty ratio starts to degrade. For example, the control circuits 5 and 14, if the pulse width at an H level becomes equal to or less than or equal to or greater than a predetermined ratio to the pulse width at an L level, may enable the functions of the adjustment circuit sections 3c, 12c, and 30c.

Moreover, by varying the capability of the transistors of the buffer circuit sections 3a, 12a, and 30a and reducing the number of transistors included in the buffer circuit sections 3a, 12a, and 30a, the circuit area may be reduced or the number of signals may be reduced.

According to the disclosed buffer circuit and semiconductor integrated circuit, the degradation of the duty ratio of a clock may be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A buffer circuit comprising:
    a buffer circuit section which includes a plurality of transistors, receives an input clock, and outputs an output clock by wave-shaping the input clock;
    a measurement circuit section which measures a first pulse width at a first potential level of the output clock and a second pulse width at a second potential level of the output clock; and
    an adjustment circuit section which keeps changing a combination of first transistors to activate among the plurality of transistors regardless of a measurement result of the measurement circuit section until the adjustment circuit section activates all combinations of the plurality of transistors and the measurement circuit section completes measurement of the first pulse width and the second pulse width in all the combinations to be activated, detects a first combination by which a ratio between the first pulse width and the second pulse width becomes closest to a target ratio among all the combinations to be activated on the basis of the measurement result of the measurement circuit section after the measurement circuit section completes the measurement, and adjusts the ratio by varying a drive capability of the buffer circuit section by activating second transistors being included in the first combination and deactivating a third transistor being excluded from the first combination.

2. The buffer circuit according to claim 1, wherein
    the plurality of transistors includes a first plurality of transistors of a first polarity and a second plurality of transistors of a second polarity, and wherein
    the adjustment circuit section varies, on the basis of the measurement result, the drive capability of the buffer circuit section by controlling a number of the first plurality of transistors of the first polarity to be activated and a number of the second plurality of transistors of the second polarity to be activated among the plurality of transistors.

3. The buffer circuit according to claim 1, wherein
    the measurement circuit section includes:
    a first flip-flop and a second flip-flop which operate in synchronization with a transition timing of the output clock from the first potential level to the second potential level;
    a third flip-flop and a fourth flip-flop which operate in synchronization with a transition timing of the output clock from the second potential level to the first potential level; and
    a delay adjustment circuit including
        a plurality of delay elements connected in series to delay output values of the first flip-flop and the third flip-flop and
        a selector which selects a delay element to be used among the plurality of delay elements, and wherein
    the measurement circuit section measures the first pulse width on the basis of a boundary value of a first delay amount due to the delay element, the first delay amount allowing the fourth flip-flop to capture the output value of the first flip-flop, and measures the second pulse width on the basis of a boundary value of a second delay amount due to the delay element, the second delay amount allowing the second flip-flop to capture the output value of the third flip-flop.

4. The buffer circuit according to claim 1, wherein
the measurement circuit section includes a filter which receives the output clock and outputs a voltage value corresponding to a ratio between the first pulse width and the second pulse width of the output clock, and wherein
the adjustment circuit section varies the drive capability of the buffer circuit section on the basis of a comparison result of the voltage value and an ideal value of the voltage value corresponding to a target ratio between the first pulse width and the second pulse width.

5. The buffer circuit according to claim 1, wherein the buffer circuit is included in a clock path which supplies the output clock to a circuit section operating in synchronization with a clock.

6. A semiconductor integrated circuit comprising:
a circuit section which operates in synchronization with a clock; and
a buffer circuit included in a clock path which supplies the clock to the circuit section, wherein
the buffer circuit includes:
a buffer circuit section which includes a plurality of transistors, receives an input clock, and outputs an output clock by wave-shaping the input clock;
a measurement circuit section which measures a first pulse width at a first potential level and a second pulse width at a second potential level of the output clock; and
an adjustment circuit section which keeps changing a combination of first transistors to activate among the plurality of transistors regardless of a measurement result of the measurement circuit section until the adjustment circuit section activates all combinations of the plurality of transistors and the measurement circuit section completes measurement of the first pulse width and the second pulse width in all the combinations to be activated, detects a first combination by which a ratio between the first pulse width and the second pulse width becomes closest to a target ratio among all the combinations to be activated on the basis of the measurement result of the measurement circuit section after the measurement circuit section completes the measurement, and adjusts the ratio by varying a drive capability of the buffer circuit section by activating second transistors being included in the first combination and deactivating a third transistor being excluded from the first combination.

7. The semiconductor integrated circuit according to claim 6, further comprising a control circuit which controls whether or not the adjustment circuit section of the buffer circuit adjusts the drive capability of the buffer circuit section.

8. The semiconductor integrated circuit according to claim 6, wherein
the plurality of transistors includes a first plurality of transistors of a first polarity and a second plurality of transistors of a second polarity, and wherein
the adjustment circuit section varies, on the basis of the measurement result, the drive capability of the buffer circuit section by controlling a number of the first plurality of transistors of the first polarity to be activated and a number of the second plurality of transistors of the second polarity to be activated among the plurality of transistors.

9. The semiconductor integrated circuit according to claim 6, wherein the measurement circuit section includes:
a first flip-flop and a second flip-flop which operate in synchronization with a transition timing of the output clock from the first potential level to the second potential level;
a third flip-flop and a fourth flip-flop which operate in synchronization with a transition timing of the output clock from the second potential level to the first potential level; and
a delay adjustment circuit including
a plurality of delay elements connected in series to delay output values of the first flip-flop and the third flip-flop and
a selector which selects a delay element to be used among the plurality of delay elements, and wherein
the measurement circuit section measures the first pulse width on the basis of a boundary value of a first delay amount due to the delay element, the first delay amount allowing the fourth flip-flop to capture the output value of the first flip-flop, and measures the second pulse width on the basis of a boundary value of a second delay amount due to the delay element, the second delay amount allowing the second flip-flop to capture the output value of the third flip-flop.

10. The semiconductor integrated circuit according to claim 6, wherein
the measurement circuit section includes a filter which receives the output clock and outputs a voltage value corresponding to a ratio between the first pulse width and the second pulse width of the output clock, and wherein
the adjustment circuit section varies the drive capability of the buffer circuit section based on a comparison result of the voltage value and an ideal value of the voltage value corresponding to a target ratio between the first pulse width and the second pulse width.

* * * * *